(12) United States Patent
Kimura et al.

(10) Patent No.: US 7,038,471 B2
(45) Date of Patent: May 2, 2006

(54) CONNECTOR FOR MEASURING ELECTRIC RESISTANCE, APPARATUS AND METHOD FOR MEASURING ELECTRIC RESISTANCE OF CIRCUIT BOARD

(75) Inventors: Kiyoshi Kimura, Saitama (JP); Ken-ichi Koyama, Saitama (JP); Fujio Hara, Saitama (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/507,891

(22) PCT Filed: Apr. 30, 2003

(86) PCT No.: PCT/JP03/05520

§ 371 (c)(1),
(2), (4) Date: Sep. 17, 2004

(87) PCT Pub. No.: WO03/093840

PCT Pub. Date: Nov. 13, 2003

(65) Prior Publication Data

US 2005/0146336 A1    Jul. 7, 2005

(30) Foreign Application Priority Data

May 1, 2002  (JP) .............................. 2002-129804

(51) Int. Cl.
*G01R 27/08* (2006.01)
(52) U.S. Cl. ...................................... 324/691; 324/538
(58) Field of Classification Search .................. 324/691, 324/724, 538
See application file for complete search history.

(56) References Cited

U.S. PATENT DOCUMENTS 6,297,652 B1 * 10/2001 Shimoda et al. ............ 324/754
6,720,787 B1 * 4/2004 Kimura et al. ............. 324/765
2005/0146336 A1    7/2005 Kimura et al.

FOREIGN PATENT DOCUMENTS

| JP | 282265/1991 | 12/1991 |
| JP | 8-29475 | 2/1996 |
| JP | 2001-235492 | 8/2001 |

OTHER PUBLICATIONS

U.S. Appl. No. 10/548,586, filed Sep. 12, 2005, Kimura et al.

* cited by examiner

*Primary Examiner*—Vincent Q. Nguyen
*Assistant Examiner*—Walter Benson
(74) *Attorney, Agent, or Firm*—Oblon, Spivak, McClelland, Maier & Neustadt, P.C.

(57) ABSTRACT

A connector for measurement of electric resistance, an electric resistance-measuring apparatus for circuit boards, and methods of measurement of electric resistance. The connector includes an insulating base plate, a plurality of connecting electrode pairs provided on a front surface of the insulating base plate, and composed of core electrodes arranged in accordance with a pattern corresponding to a pattern of a plurality of electrodes to be inspected in a circuit board to be inspected and ring-like electrodes arranged to surround the respective core electrodes in a state electrically insulated from the core electrodes, and a plurality of relay electrodes provided on a back surface of the insulating base plate and electrically connected to either one of the core electrode or ring-like electrode of the connecting electrode pairs.

13 Claims, 8 Drawing Sheets

CONNECTOR FOR MEASURING ELECTRIC RESISTANCE, APPARATUS AND METHOD FOR MEASURING ELECTRIC RESISTANCE OF CIRCUIT BOARD

TECHNICAL FIELD

The present invention relates to a connector for measurement of electric resistance, and electric resistance-measuring apparatus for circuit board and method of measurement.

BACKGROUND ART

In recent years, with the request for speeding-up of signal transmission in electronic parts and electronic equipments containing such a part therein, there has been a demand for development of those low in electric resistance of wiring between electrodes as circuit boards for fabricating LSI packages such as BGA and CSP or circuit boards, on which these semiconductor devices are mounted. Therefore, it is extremely important to measure the electric resistance of wiring between electrodes of such a circuit board with high precision in electrical inspection of the circuit board.

Figure 11:
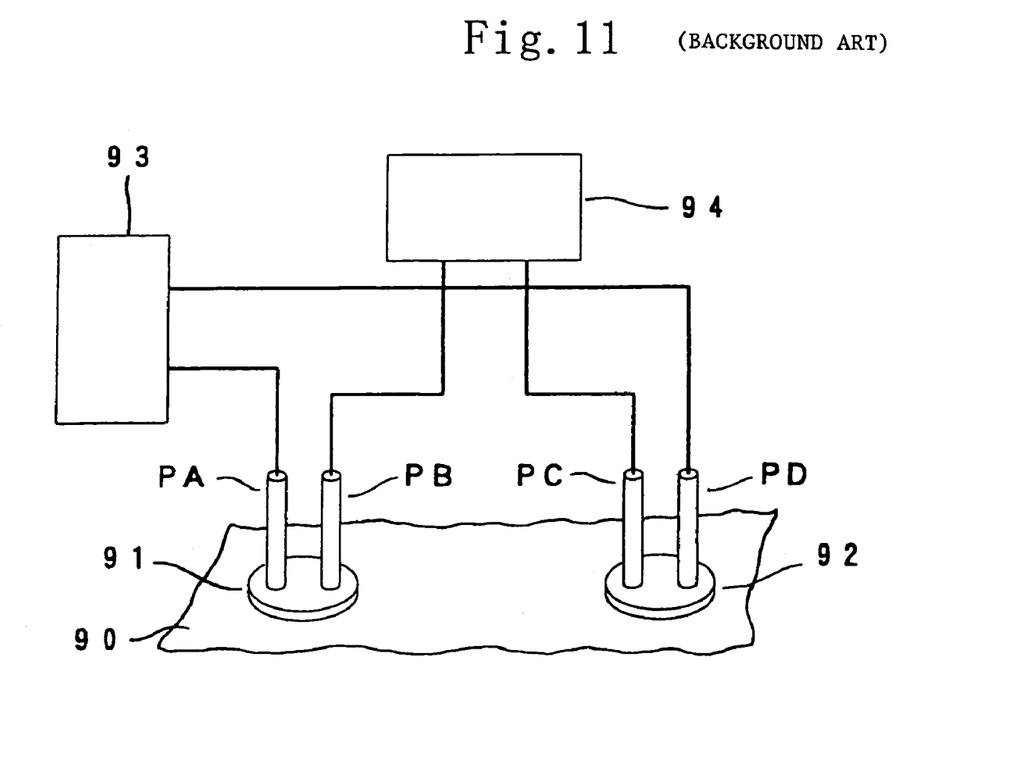
FIG. 11 typically illustrates an apparatus for measuring an electric resistance between electrodes in a circuit board by probes for current supply and probes for voltage measurement.

In the measurement of an electric resistance of a circuit board, there has heretofore been adopted, for example, the four probe method, in which probes PA and PD for current supply and probes PB and PC for voltage measurement are pressed against and brought into contact with respective 2 electrodes 91 and 92 to be inspected, which have been electrically connected to each other in a circuit board 90 to be inspected, as illustrated in FIG. 11, a current is supplied between the probes PA and PD for current supply from a power supply device 93 in this state, and a voltage signal detected by the probes PB and PC for voltage measurement at this time is processed in an electric signal processor 94, thereby finding an electric resistance value between the electrodes 91 and 92 to be inspected.

In the method described above, however, the surfaces of the electrodes 91 and 92 to be inspected may be damaged by pressing the probes because it is necessary to bring the probes PA and PD for current supply and the probes PB and PC for voltage measurement into contact with the respective electrodes 91 and 92 to be inspected by considerably high pressing force, the probes are made of a metal, and the tips thereof are pointed. Therefore the circuit board becomes impossible to be used. Under such circumstances, the electric resistance measurement cannot be performed on all circuit boards to be provided as products, and so so-called sampling inspection has to be performed. After all, the yield of the products cannot be increased.

In order to solve such a problem, there have heretofore been proposed electric resistance-measuring apparatus, in which a connecting member coming into contact with electrodes to be inspected is formed by a conductive elastomer.

For example, (i) Japanese Patent Application Laid-Open No. 26446/1997 discloses an electric resistance-measuring apparatus, in which elastic connecting members formed of conductive rubber obtained by binding conductive particles with an elastomer are arranged at electrodes for current supply and electrodes for voltage measurement, respectively, (ii) Japanese Patent Application Laid-Open No. 2000-74965 discloses an electric resistance-measuring apparatus having a common elastic connecting member formed of an anisotropically conductive elastomer, which is provided so as to come into contact with surfaces of both electrode for current supply and electrode for voltage measurement electrically connected to the same electrode to be inspected, and (iii) Japanese Patent Application Laid-Open No. 2000-241485 discloses an electric resistance-measuring apparatus comprising a circuit board for inspection, on the surface of which a plurality of inspection electrodes have been formed, and an elastic connecting member formed of a conductive elastomer, which is and provided on the surface of the circuit board for inspection, wherein 2 electrodes of the inspection electrodes are selected in a state that electrodes to be inspected have been electrically connected to the plurality of the inspection electrodes through the connecting member, one of both electrodes is used as an electrode for current supply, and the other is used as an electrode for voltage measurement to measure an electric resistance.

According to such electric resistance-measuring apparatus, an electrode for current supply and an electrode for voltage measurement are brought into contact with electrodes to be inspected of a circuit board to be inspected through the elastic connecting member, whereby electrical connection is achieved, so that the measurement of the electric resistance can be conducted without damaging the electrodes to be inspected.

However, the measurement of an electric resistance between electrodes by the electric resistance-measuring apparatus of the construction (i) or (ii) involves the following problems.

In recent years, the size and pitch or interelectrode distance of electrodes in a circuit board have tended to become small for the purpose of achieving a high degree of integration. In the electric resistance-measuring apparatus of the construction (i) or (ii), however, it is necessary to electrically connect both electrodes for current supply and electrodes for voltage measurement at the same time to electrodes to be inspected in a circuit board to be inspected, which is subjected to electric resistance measurement, through the elastic connecting member, respectively. In the electric resistance-measurement apparatus for measuring an electric resistance as to a circuit board to be inspected, on which small-sized electrodes to be inspected have been arranged at a high density, accordingly, it is thus necessary to form electrodes for current supply and electrodes for voltage measurement in a state separated from one another, corresponding to individual small-sized electrodes to be inspected, in a region of an area equal to or smaller than a region occupied by the electrodes to be inspected, i.e., to form electrodes for current supply and electrodes for voltage measurement smaller in size than the electrodes to be inspected in a state separated from one another at an extremely short distance.

On the other hand, in order to improve productivity, a production process to produce a plurality of circuit board separated from each other by producing a combined circuit board composed of a plurality of circuit boards linked together from a base plate material, collectively conducting electrical inspection as to the respective circuit boards in the combined circuit board in this state and then cutting the combined circuit board is adapted.

However, since the area of the combined circuit board, which is an inspection target, is considerably large, and number of electrodes to be inspected is also extremely great, and, when multi-layer circuit boards are produced in particular, the number of steps in the production process thereof is great, and the number of times subjected to thermal hysteresis history by a heating treatment is great, the electrodes to be inspected are often formed in a state misregistered from the prescribed arrangement positions. When measurement of an electric resistance is performed as to the circuit boards to be inspected, which are large in area and have a great number of electrodes to be inspected formed in a state misregistered from the prescribed arrangement positions, by the electric resistance-measuring apparatus of the construction (i) or (ii), it is extremely difficult to electrically connect both electrodes for current supply and electrodes for voltage measurement at the same time to the respective electrodes to be inspected.

Figure 12:
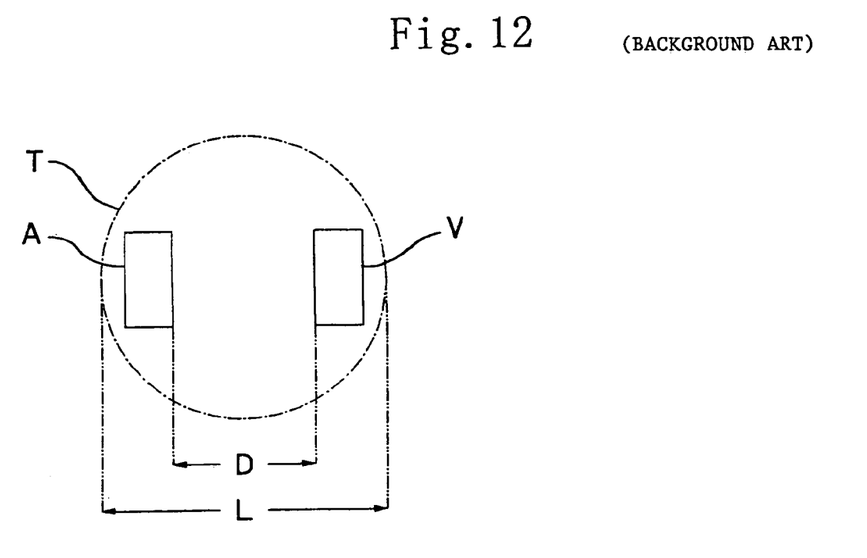
FIG. 12 illustrates a state that an electrode for current supply and an electrode for voltage measurement have been correctly arranged on an electrode to be inspected in a conventional electric resistance-measuring apparatus for circuit boards.
Figure 13:
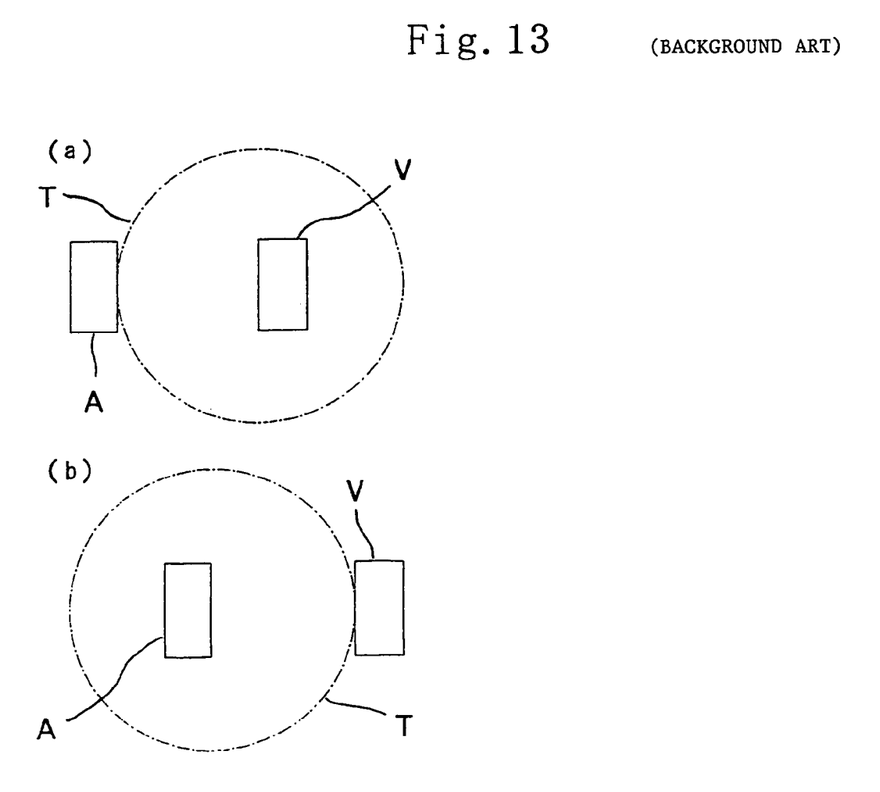
FIG. 13 illustrates a state that an electrode for current supply and an electrode for voltage measurement have been arranged in a state misregistered on an electrode to be inspected in a conventional electric resistance-measuring apparatus for circuit boards.

Description is given by a specific example. When an electric resistance as to an electrode T to be inspected having a diameter L of 300 μm as shown in FIG. 12 is measured, a clearance D between an electrode A for current supply and an electrode V for voltage measurement to be electrically connected to the electrode T to be inspected is about 150 μm. When the position of the electrode T to be inspected to the electrode A for current supply and the electrode V for voltage measurement deviates from the prescribed position shown in FIG. 12 by 75 μm in a direction that the electrode A for current supply and the electrode V for voltage measurement are arranged in alignment of a circuit board to be inspected as shown in FIGS. 13(a) and 13(b), electrical connection between either one of the electrode A for current supply or the electrode V for voltage measurement and the electrode T to be inspected is not achieved, and so necessary measurement of the electric resistance cannot be conducted.

As a means for solving such a problem, it is considered to make the clearance D between the electrode A for current supply and the electrode V for voltage measurement smaller, for example, to an extent of 100 μm or smaller. It is however extremely difficult in fact to produce such an electric resistance-measuring apparatus.

On the other hand, according to the electric resistance-measuring apparatus (iii), there is no need to form electrodes for current supply and electrodes for voltage measurement corresponding to individual electrodes to be inspected, and so capacity for misregistration to electrodes to be inspected becomes high even when a circuit board to be inspected which is subjected to the measurement of electric resistance is large in area and has a great number of electrodes to be inspected, and the small-sized electrodes to be inspected are arranged at a high density. In addition, such an electric resistance-measuring apparatus is easily produced.

However, such an electric resistance-measuring apparatus is great in measurement error range because it is a measuring apparatus according to the so-called pseudo-four-probe method, and so it is difficult to perform electric resistance measurement as to a circuit board low in electric resistance between electrodes with high precision.

DISCLOSURE OF THE INVENTION

The present invention has been made on the basis of the foregoing circumstances and has as its first object the provision of a connector for measurement of electric resistance, and an electric resistance-measuring apparatus for circuit boards and method of measurement of electric resistance, by which necessary electrical connection to a circuit board to be inspected, which is subjected to electric resistance measurement, can be surely achieved even when the circuit board to be inspected is large in area and has a great number of small-sized electrodes to be inspected, and expected measurement of electric resistance can be surely performed with high precision.

According to the present invention, there is provided a connector for measurement of electric resistance, comprising an insulating base plate, a plurality of connecting electrode pairs provided on a front surface of the insulating base plate and, composed of core electrodes arranged in accordance with a pattern corresponding to a pattern of a plurality of electrodes to be inspected in a circuit board to be inspected, which is subjected to electric resistance measurement and ring-like electrodes arranged so as to surround the respective core electrodes in a state electrically insulated from the core electrodes, and a plurality of relay electrodes provided on a back surface of the insulating base plate and electrically connected to either one of the core electrode or ring-like electrode in the connecting electrode pairs.

According to the present invention, there is provided an electric resistance-measuring apparatus for circuit boards, comprising the above-described connector for measurement of electric resistance arranged on one side of a circuit board to be inspected, which is subjected to electric resistance measurement, wherein the core electrodes and ring-like electrodes of the connecting electrode pairs of the connector for measurement of electric resistance are electrically connected at the same time to respective one-side electrodes to be inspected in the circuit board to be inspected, thereby realizing a measurable state, and in this measurable state, one of the core electrode and ring-like electrode electrically connected to one designated one-side electrode to be inspected is used as an electrode for current supply, and the other is used as an electrode for voltage measurement, thereby performing measurement of electric resistance related to the designated one one-side electrode to be inspected.

The electric resistance-measuring apparatus for circuit boards according to the present invention may preferably comprise a one-side circuit board for inspection arranged on a back surface of the connector for measurement of electric resistance through an anisotropically conductive sheet and having, on its surface, inspection electrodes arranged in accordance with a pattern corresponding to a pattern of the relay electrodes of the connector for measurement of electric resistance, wherein in the measurable state, the inspection electrodes are electrically connected with their corresponding relay electrodes through the anisotropically conductive sheet.

The electric resistance-measuring apparatus for circuit boards may preferably further comprise an other-side circuit board for inspection arranged on the other side of the circuit board to be inspected, wherein the other-side circuit board for inspection has, on its surface, inspection electrodes for current supply and inspection electrodes for voltage measurement, which are arranged in a state separated from each other corresponding to other-side electrodes to be inspected of the circuit board to be inspected and electrically connected to the same other-side electrodes to be inspected.

According to the present invention, there is provided a method of measurement of electric resistance for circuit boards, which comprises arranging the above-described connector for measurement of electric resistance on one side of a circuit board to be inspected, which is subjected to electric resistance measurement, electrically connecting the core electrodes and ring-like electrodes of the connecting electrode pairs of the connector for measurement of electric resistance at the same time to respective one-side electrodes to be inspected of the circuit board to be inspected, thereby realizing a measurable state, and in this measurable state, using one of the core electrode and ring-like electrode electrically connected to one designated one-side electrode to be inspected as an electrode for current supply and the other as an electrode for voltage measurement, thereby performing measurement of electric resistance related to the designated a one-side electrode to be inspected.

According to the connector for measurement of electric resistance of the above-described construction, the connector has core electrodes arranged in accordance with a pattern corresponding to a pattern of electrodes to be inspected in a circuit board to be inspected and ring-like electrodes arranged so as to surround the respective core electrodes, so that at least a part of the ring-like electrode is located on the electrode to be inspected in the circuit board to be inspected so far as alignment is conducted in such a manner that at least a part of the core electrode is located on the electrode to be inspected, whereby electrical connection of both core electrodes and ring-like electrodes to the electrodes to be inspected is surely achieved.

In addition, since the core electrodes and ring-like electrodes are electrically insulated from each other, an electric resistance as to the circuit board to be inspected can be measured with high precision by using one of the core electrode and ring-like electrode electrically connected to the electrode to be inspected as an electrode for current supply and the other as an electrode for voltage measurement.

DESCRIPTION OF CHARACTERS

1 Circuit board to be inspected,
2 One-side electrodes to be inspected,
3 Other-side electrodes to be inspected,
5 Anisotropically conductive sheet,
10 Connector for measurement of electric resistance,
11 Insulating base plate, 12 Conductors
13 Core electrodes, 14 Relay electrodes,
15 Ring-like electrodes,
16 Connecting electrode pairs,
17 Relay electrodes, 18 Wiring part,
19 Short circuit parts,
20 First upper-side anisotropically conductive sheet,
21 Conductive path-forming parts,
22 Insulating parts,
25 Third upper-side anisotropically conductive sheet,
40 Upper-side adaptor,
41 One-side circuit board for inspection,
42 Inspection electrodes, 43 Terminal electrodes,
47 Second upper-side anisotropically conductive sheet,
48 Electrode plate,
49 Standard arrangement electrodes,
50 Lower-side adaptor,
51 Other-side circuit board for inspection,
52 Inspection electrodes for current supply,
52*a* Terminal electrodes for current supply,
53 Inspection electrodes for voltage measurement,
53*a* Terminal electrodes for voltage measurement,
56 Elastic connecting member,
57 Holding member, 59 Tester,
60 Electrode plate,
61 Standard arrangement electrodes,
62 Lower-side anisotropically conductive sheet,
90 Circuit board to be inspected,
91, 92 Electrodes to be inspected,
93 Power supply device,
94 Electric signal processor,
PA, PD Probes for current supply,
PB, PC Probes for voltage measurement,
A Electrode for current supply,
V Electrode for voltage measurement,
T Electrode to be inspected,
P Conductive particles

BEST MODE FOR CARRYING OUT THE INVENTION

The embodiments of the present invention will hereinafter be described in details.

<Connector for Measurement of Electric Resistance>

Figure 1:
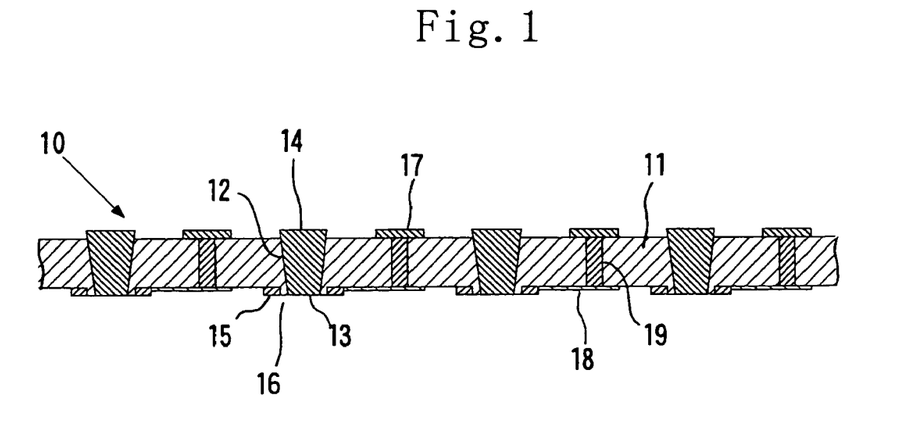
FIG. 1 is a cross-sectional view illustrating the construction of an exemplary connector for measurement of electric resistance according to the present invention.

FIG. 1 is a cross-sectional view illustrating the construction of a part of an exemplary connector for measurement of electric resistance according to the present invention. This connector 10 for measurement of electric resistance is used for measuring an electric resistance between electrodes in a circuit board.

The connector for measurement of electric resistance shown in FIG. 1 has an insulating base plate 11. In the insulating base plate 11, a plurality of truncated cone-like conductors 12, which become gradually greater in diameter as they go toward a back surface from a front surface thereof, are formed in accordance with a pattern corresponding to a pattern of electrodes to be inspected in a circuit board, which is subjected to electric resistance measurement, so as to extend through in a thickness-wise direction of the insulating base plate and project from both surfaces thereof. A core electrode 13 is formed by an end part on the front surface side of each of the conductors 12, and a relay electrode 14 is formed by the other end part on the back surface side of the conductor 12.

Figure 2:
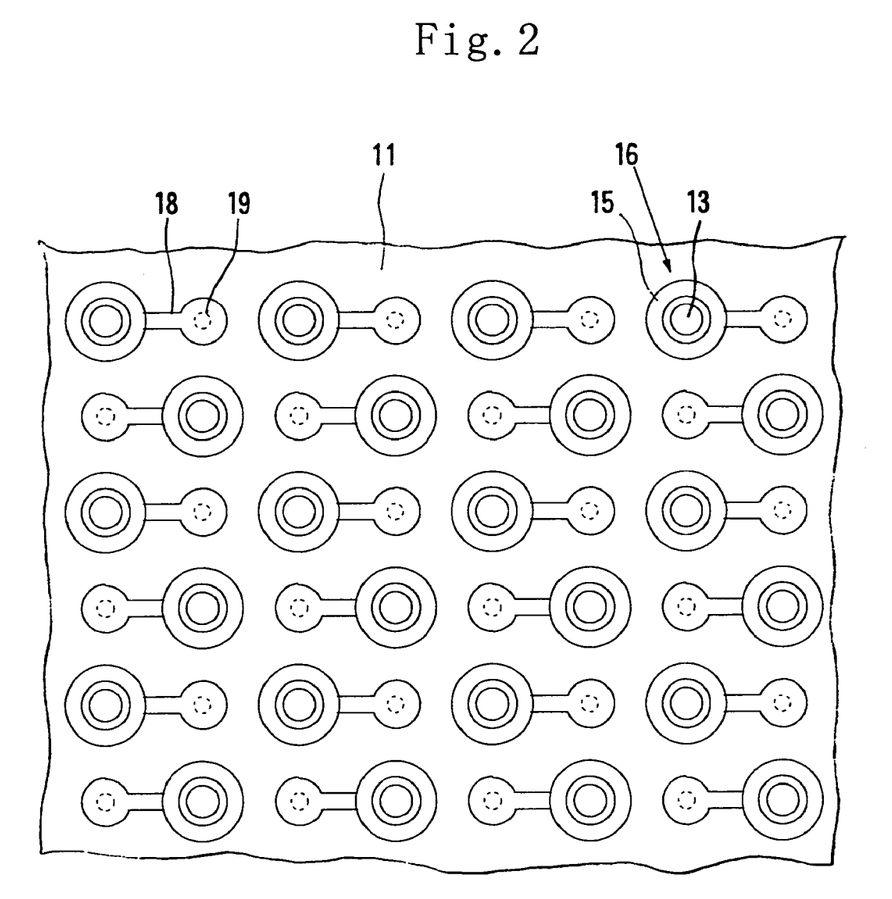
FIG. 2 illustrates electrode arrangement on a front surface of the connector for measurement of electric resistance shown in FIG. 1.

As illustrated in FIG. 2 also, a plurality of ring-like electrodes 15 surrounding the respective core electrodes 13 are arranged on the front surface (lower surface in FIG. 1) of the insulating base plate 11 so as to project from the front surface of the insulating base plate 11 in a state electrically insulated from the core electrodes 13. A connecting electrode pair 16 to be electrically connected to an electrode to be inspected in a circuit board to be inspected is formed by each of the core electrodes 13 and the ring-like electrode 15 surrounding it. In the embodiment illustrated, the projected heights from the surface of the insulating base plate 11 of the core electrodes 13 and the ring-like electrodes 15 are substantially the same as each other.

Figure 3:
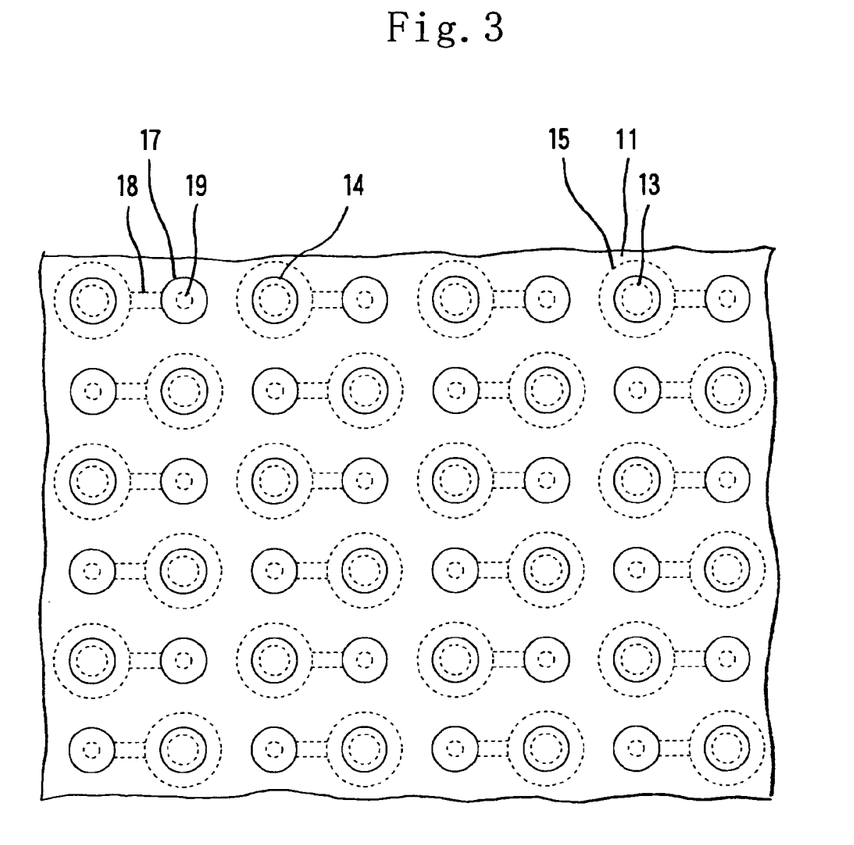
FIG. 3 illustrates electrode arrangement on a back surface of the connector for measurement of electric resistance shown in FIG. 1.

As illustrated in FIG. 3 also, a plurality of relay electrodes 17 independent from the relay electrodes 14 by the conductors 12 are formed at positions between the relay electrodes 14 by the adjacent conductors 12 on the back surface (upper surface in FIG. 1) of the insulating base plate 11. The each of relay electrodes 17 are electrically connected to their corresponding ring-like electrodes 15 through a wiring part 18 formed on the front surface of the insulating base plate 11 and short circuit parts 19 extending through in the thickness-wise direction of the insulating base plate 11.

As a material for forming the insulating base plate 11, may be used a polyimide resin, glass fiber-reinforced polyimide resin, glass fiber-reinforced epoxy resin, glass fiber-reinforced bismaleimide triazine resin or the like. The insulating base plate 11 may be a singly-layer structure or multi-layer structure.

The thickness of the insulating base plate 11 is preferably, for example, 50 to 1,000 μm, more preferably 100 to 500 μm.

As a material for forming the core electrodes 13, i.e., the conductors 12, may be used a metal such as nickel, iron, cobalt, copper, gold, silver or aluminum, an alloy thereof, a laminate thereof, or a cured product of a conductive paste containing powder of these metals. However, a metal is preferably used in that high conductivity is achieved.

The diameter of the core electrodes 13 is preset according to the diameter of electrodes to be inspected electrically connected to the respective core electrodes 13 and is preferably 30 to 80%, more preferably 40 to 60% of the diameter of the electrodes to be inspected in that electrical connection to the electrodes to be inspected can be surely achieved.

The projected height of the core electrodes 13 from the insulating base plate 11 is preferably 20 to 100 μm, more preferably 30 to 70 μm.

As a material for forming the ring-like electrodes 15, may be used copper, nickel, gold or a laminate of these metals.

The inner diameter of the ring-like electrodes 15 is preset according to the diameter of electrodes to be inspected electrically connected to the respective ring-like electrodes 15 and is preferably 50 to 110%, more preferably 70 to 100%, particularly preferably 75 to 95% of the diameter of the electrodes to be inspected in that electrical connection to the electrodes to be inspected can be surely achieved.

The inner diameter of the ring-like electrodes 15 is preferably 1.1 to 2 times, more preferably 1.2 to 1.7 times of the diameter of the core electrodes 13 from the viewpoint of surely retaining the insulating properties between the core electrodes 13 and the ring-like electrodes 15.

The projected height of the ring-like electrodes 15 from the insulating base plate 11 is preferably 20 to 100 μm, more preferably 30 to 70 μm.

The conductors 12 can be formed by, for example, forming through-holes in the insulating base plate 11 by a proper meaning, for example, drilling or laser beam machining, and filling in the through-holes with a metal by a plating treatment or the like or filling in them with a conductive paste to subject the conductive paste to a curing treatment.

The ring-like electrodes 15, relay electrodes 17, wiring parts 18 and short circuit parts 19 can be formed by a method generally used for producing a printed wiring board.

Figure 4:
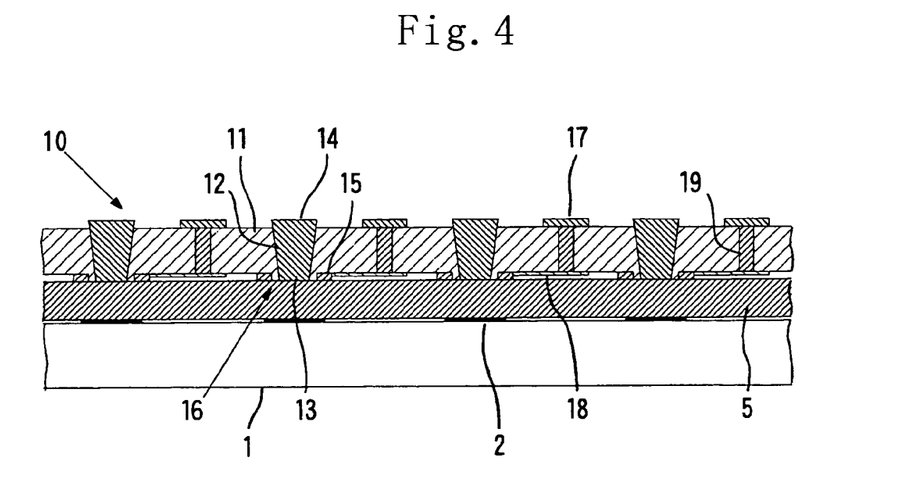
FIG. 4 is a cross-sectional view illustrating a state that the connector for measurement of electric resistance shown in FIG. 1 has been arranged on one surface of a circuit board to be inspected.

The connector 10 for measurement of electric resistance is arranged on one surface of a circuit board 1 to be inspected, which is subjected to electric resistance measurement, through, for example, an anisotropically conductive sheet 5 in such a manner that respective core electrodes 13 in the connector 10 for measurement of electric resistance are located on the respective one-side electrodes 2 to be inspected of a circuit board 1 to be inspected as illustrated in FIG. 4, and pressed by a proper meaning, thereby, the connecting electrode pairs 16 of the connector 10 for measurement of electric resistance are electrically connected to the one-side electrodes 2 to be inspected of the circuit board 1 to be inspected through an anisotropically conductive sheet 5.

Figure 5:
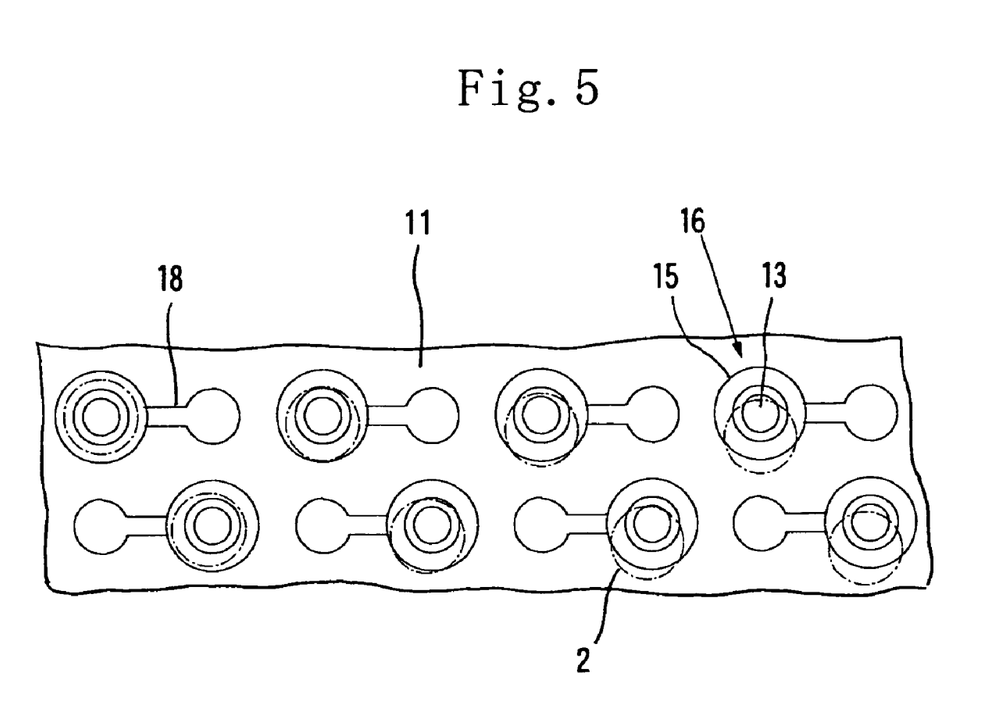
FIG. 5 illustrates a state that misregistration has occurred between electrodes to be inspected and connecting electrode pairs.

At this time, even when the central positions of the core electrodes 13 deviate from the respective central positions of the one-side electrodes 2 to be inspected as illustrated in FIG. 5, the ring-like electrodes 15 are certainly electrically connected to the one-side electrodes 2 to be inspected so far as the core electrodes 13 are electrically connected to the respective one-side electrodes 2 to be inspected because the ring-like electrodes 15 are formed so as to surround the respective core electrodes 13.

In such a state, one of a plurality of the one-side electrodes 2 to be inspected in the circuit board 1 to be inspected is designated, and one of the core electrode 13 and ring-like electrode 15 electrically connected to this designated electrode 2 to be inspected is used as an electrode for current supply, and the other is used as an electrode for voltage measurement, thereby performing measurement of an electric resistance related to the designated one-side electrode 2 to be inspected.

Figure 6:
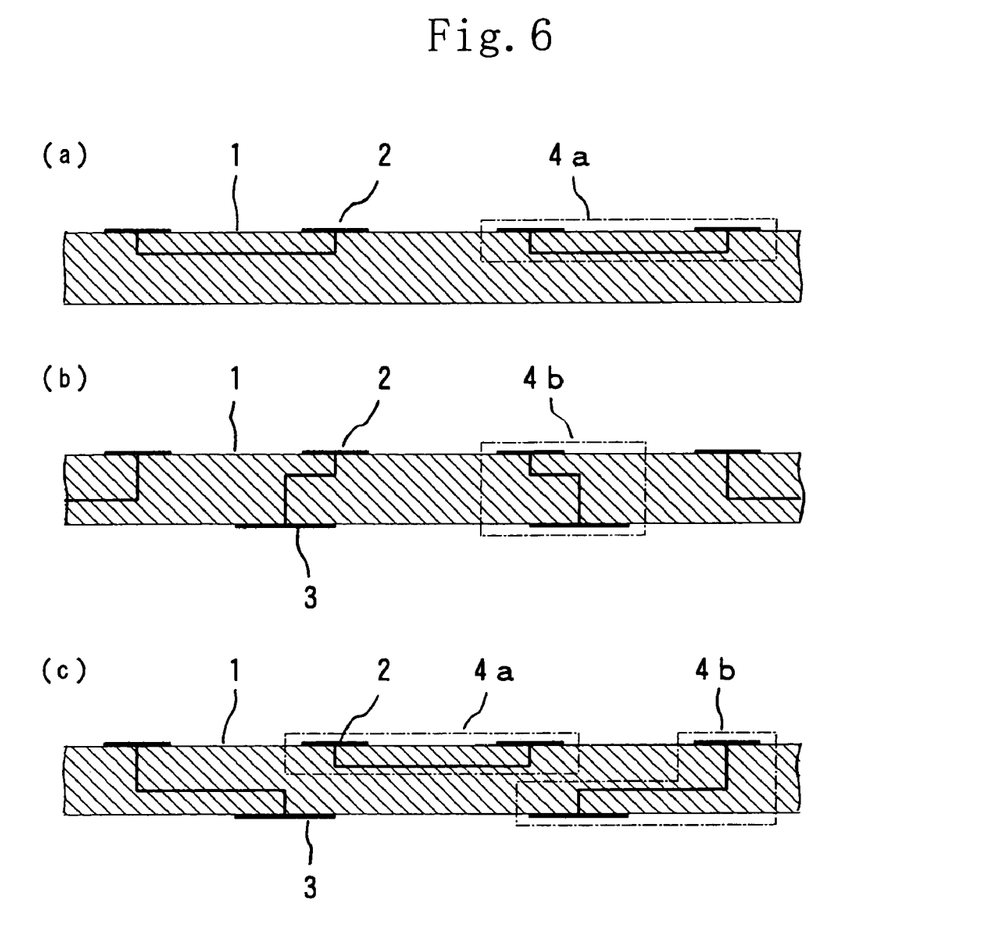
FIG. 6 is a sectional view illustrating the construction of a circuit board to be inspected.

The circuit board 1 to be inspected, which is subjected to electric resistance measurement, may be any of a circuit board having only one-side electrodes 2 to be inspected formed on one surface thereof and having only a circuit 4a formed between the one-side electrodes 2 to be inspected as illustrated in FIG. 6(*a*), a circuit board having one-side electrodes 2 to be inspected formed on one surface thereof and other-side electrodes 3 to be inspected formed on the other side and having only a circuit 4b formed between the one-side electrode 2 to be inspected and the other-side electrode 3 to be inspected as illustrated in FIG. 6(*b*), and a circuit board having one-side electrodes 2 to be inspected formed on one surface thereof and the other-side electrodes 3 to be inspected formed on the other side and having both circuit 4a formed between the one-side electrodes 2 to be inspected and circuit 4b formed between the one-side electrode 2 to be inspected and the other-side electrode 3 to be inspected as illustrated in FIG. 6(*c*).

According to the connector 10 for measurement of electric resistance of the above-described construction, the ring-like electrodes 15 are formed about the respective core electrodes 13 arranged in accordance with a pattern corresponding to a pattern of the one-side electrodes 2 to be inspected in the circuit board 1 to be inspected so as to surround the respective core electrodes 13, so that at least a part of the ring-like electrode 15 is located on the one-side electrode 2 to be inspected in the circuit board 1 to be inspected so far as alignment is conducted in such a manner that at least a part of the core electrode 13 is located on the one-side electrode 2 to be inspected. Accordingly, electrical connection of both core electrodes 13 and ring-like electrodes 15 to the one-side electrodes 2 to be inspected can be surely achieved even when the circuit board 1 to be inspected is large in area and has a great number of small-sized one-side electrodes 2 to be inspected. In addition, since the core electrodes 13 and ring-like electrodes 15 are electrically insulated from each other, an electric resistance as to the circuit board 1 to be inspected can be measured with high precision by using one of the core electrode 13 and ring-like electrode 15 electrically connected to the one-side electrode 2 to be inspected as an electrode for current supply and the other as an electrode for voltage measurement.

In the connector for measurement of electric resistance according to the present invention, various changes or modifications may be added without being limited to the above-described embodiment.

Figure 7:
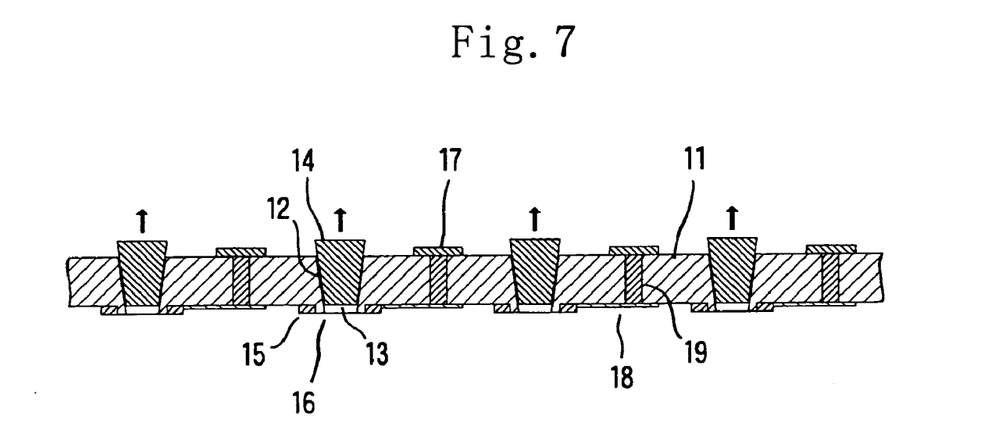
FIG. 7 is a cross-sectional view illustrating a principal part of a connector for measurement of electric resistance according to another embodiment of the present invention.

For example, the conductors 12 may have a structure that they are supported movably in a thickness-wise direction of the insulating base plate 11 as illustrated in FIG. 7, specifically, a structure that tapered through-holes, which extend through in the thickness-wise direction and become gradually greater in diameter as they go toward a back surface from a front surface of the base plate 11, are formed in the insulating base plate 11, and each of truncated cone-like conductors 12 fitted to the respective through-holes is supported movably in the thickness-wise direction so as to separate from and contact with the inner wall surface of the through-hole.

According to such a structure, the core electrode 13, i.e., the conductor 12 is moved in the thickness-wise direction according to the projected height of the electrode to be inspected, so that the irregularity-absorbing property of the anisotropically conductive sheet arranged on the front surface of the connector 10 for measurement of electric resistance can be effectively utilized, whereby high reliability in connection is achieved even to a circuit board to be inspected that has, for example, protruding electrodes to be inspected, a scatter of projected height of said protruding electrodes to be inspected being great. As a result, necessary measurement of electric resistance can be surely performed with high precision.

<Electric Resistance-Measuring Apparatus for Circuit Board>

Figure 8:
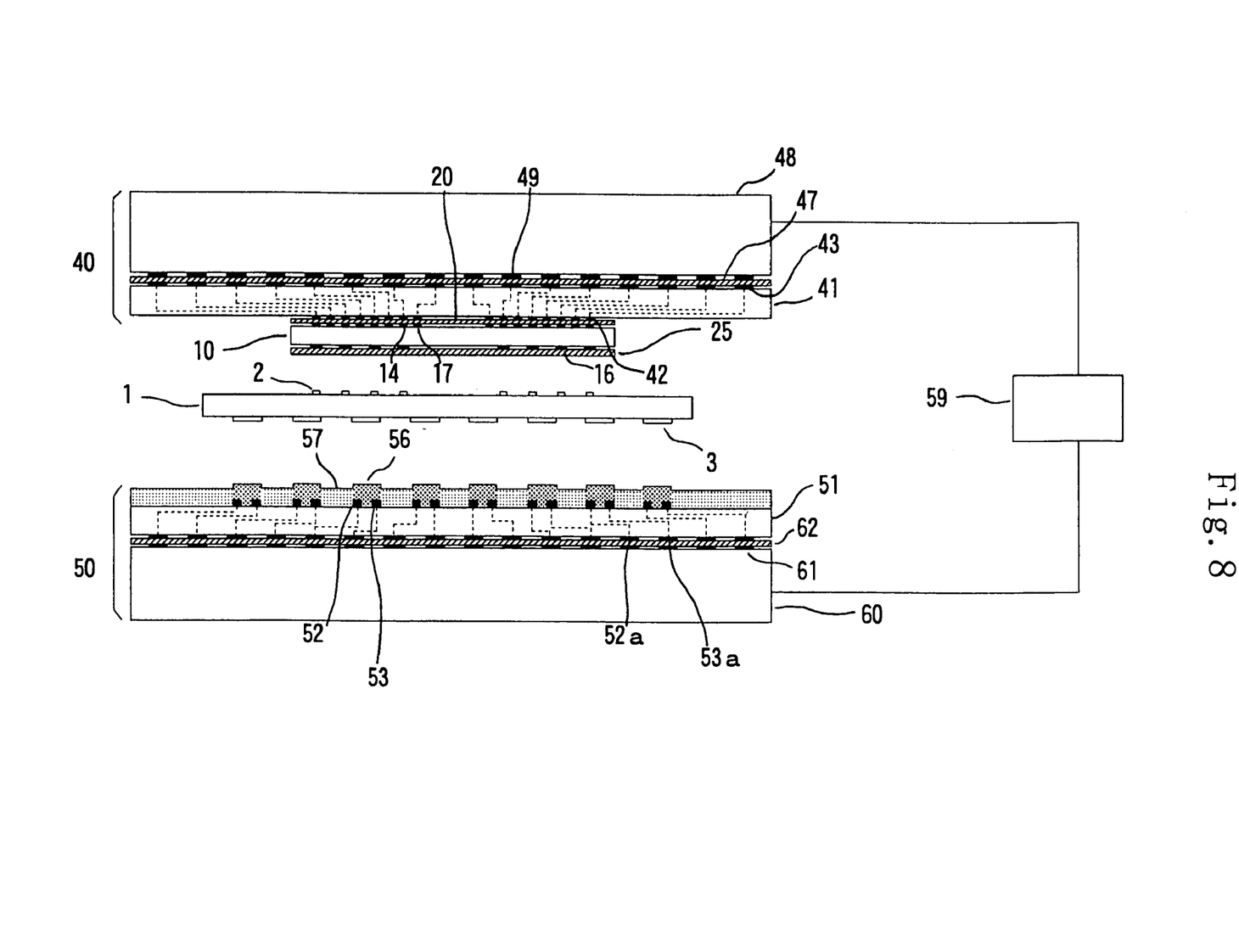
FIG. 8 is a cross-sectional view schematically illustrating the construction of an electric resistance-measuring apparatus for circuit boards according to an embodiment of the present invention together with a circuit board to be inspected.
Figure 9:
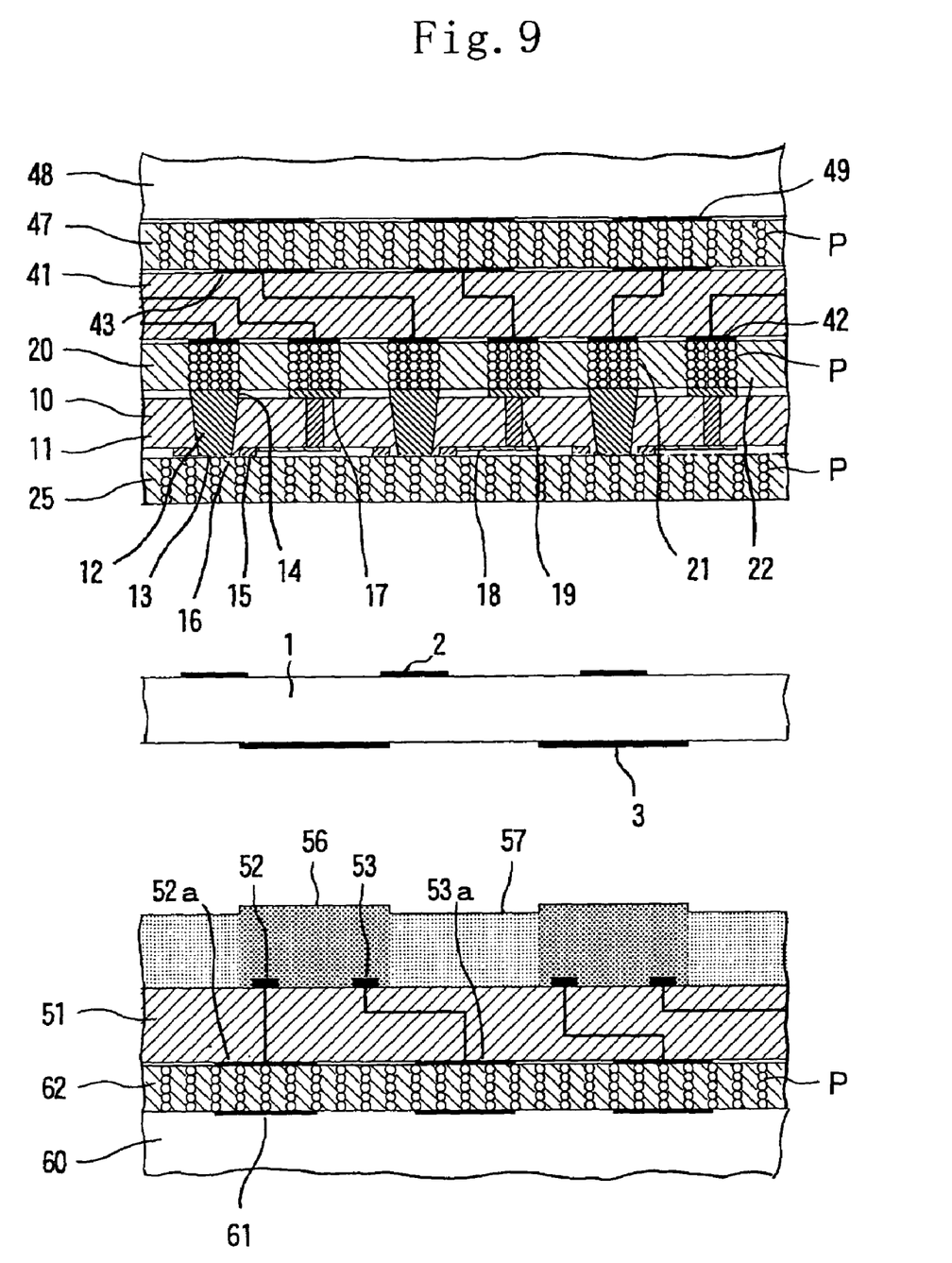
FIG. 9 is a cross-sectional view, on an enlarged scale, illustrating a principal part of the electric resistance-measuring apparatus for circuit boards shown in FIG. 8.

FIG. 8 illustrates the construction of an electric resistance-measuring apparatus for circuit boards according to an embodiment of the present invention, and FIG. 9 is a cross-sectional view, on an enlarged scale, illustrating a principal part of the electric resistance-measuring apparatus for circuit boards shown in FIG. 8.

This electric resistance-measuring apparatus for circuit boards is constructed by vertically arranging an upper-side adaptor 40 arranged on one side (upper surface side in FIG. 8) of a circuit board 1 to be inspected, the electric resistance of which should be measured, and a lower-side adaptor 50 arranged on the other side (lower surface side in FIG. 8) of the circuit board 1 to be inspected in opposed relation to each other.

In the upper-side adaptor 40, a connector 10 for measurement of electric resistance of the construction shown in, for example, FIG. 1, which is arranged on one side (upper side in FIG. 8) of the circuit board 1 to be inspected, is provided. On the back surface (upper surface in FIG. 8) of the connector 10 for measurement of electric resistance, a one-side circuit board 41 for inspection is arranged through a first upper-side anisotropically conductive sheet 20. A plurality of inspection electrodes 42 are arranged on a front surface (lower surface in FIG. 8) of this one-side circuit board 41 for inspection according to a pattern corresponding to a pattern of the relay electrodes 14, 17 in the connector 10 for measurement of electric resistance. On the back surface (upper surface in FIG. 8) of the one-side circuit board 41 for inspection, terminal electrodes 43 are arranged in accordance with a pattern corresponding to an arrangement pattern of standard arrangement electrodes 49 of an electrode plate 48, which will be described subsequently, and the respective terminal electrodes 43 are electrically connected to their corresponding inspection electrodes 42.

An electrode plate 48 is provided on the back surface of the one-side circuit board 41 for inspection through a second upper-side anisotropically conductive sheet 47. This electrode plate 48 has, on the front surface (lower surface in FIG. 8) thereof, standard arrangement electrodes 49 arranged on standard lattice points having a pitch of, for example, 2.54 mm, 1.8 mm or 1.27 mm. The standard arrangement electrodes 49 are respectively electrically connected to the terminal electrodes 43 of the one-side circuit board 41 for inspection through the second upper-side anisotropically conductive sheet 47 and to a tester 59 through inner wiring (not illustrated) of the electrode plate 48.

A third upper-side anisotropically conductive sheet 25 is arranged on the front surface of the connector 10 for measurement of electric resistance.

The first upper-side anisotropically conductive sheet 20 in this embodiment is the so-called uneven distribution type anisotropically conductive sheet composed of a plurality of conductive path-forming portions 21 arranged in accordance with a pattern corresponding to the pattern of the relay electrodes 14, 17 of the connector 10 for measurement of electric resistance and extending in the thickness-wise direction and insulating portions 22 interposed between these conductive path-forming portions 21 to mutually insulate these conductive path-forming portions.

The conductive path-forming portions 21 are each formed by causing conductive particles P exhibiting magnetism to be contained at high density in an elastic polymeric substance making up a base material of the first upper-side anisotropically conductive sheet 20 in a state oriented so as to align in the thickness-wise direction thereof. Conductive paths are formed by respective chains of the conductive particles P. On the other hand, the insulating portions 22 do not contain the conductive particles P at all or scarcely contain them.

As examples of the conductive particles P making up the conductive path-forming portions 21, may be mentioned particles of metals exhibiting magnetism, such as nickel, iron and cobalt, particles of alloys thereof and particles containing such a metal; particles obtained by using these particles as core particles and plating the core particles with a metal having good conductivity, such as gold, silver, palladium or rhodium; and particles obtained by using particles of a non-magnetic metal, inorganic particles such as glass beads or polymer particles as core particles and plating the core particles with a conductive magnetic material such as nickel or cobalt.

Among these, particles obtained by using nickel particles as core particles and plating them with a metal having good conductivity, such as gold or silver are preferably used.

The particle diameter of the conductive particles P is preferably 3 to 200 μm, particularly 10 to 100 μm in order that deformation under pressure of the resulting conductive path-forming portions 21 is made easy, and sufficient electrical contact is achieved among the conductive particles P in the conductive path-forming portions 21.

The water content in the conductive particles P is preferably at most 5%, more preferably at most 3%, still more preferably at most 2%, particularly preferably at most 1%. The use of the conductive particles satisfying such conditions can prevent or inhibit the occurrence of bubbles in the first upper-side anisotropically conductive sheet 20 upon the formation thereof.

The proportion of the conductive particles P in the conductive path-forming portions 21 is preferably 5 to 60%, more preferably 7 to 50%, particularly preferably 10 to 40% in terms of volume fraction. If this proportion is lower than 5%, it may be difficult in some cased to form conductive paths sufficiently low in electric resistance value. If the proportion exceeds 60% on the other hand, the resulting conductive path-forming portions 21 become brittle, so that elasticity required of the conductive path-forming portions may not be achieved in some cases.

The insulating elastic polymeric substance making up the base material of the first upper-side anisotropically conductive sheet 20 is preferably a polymeric substance having a crosslinked structure. As a material for the polymeric substance usable for obtaining the polymeric substance having the crosslinked structure, may be used various materials. Specific examples thereof include conjugated diene rubbers such as polybutadiene rubber, natural rubber, polyisoprene rubber, styrene-butadiene copolymer rubber and acrylonitrile-butadiene copolymer rubber and hydrogenated products thereof; block copolymer rubbers such as styrene-butadiene block copolymer rubber and hydrogenated products thereof; and silicone rubber, fluorine-containing rubber, silicone-modified fluorine-containing rubber, ethylene-propylene copolymer rubber, urethane rubber, polyester rubber, chloroprene rubber and epichlorohydrin rubber.

Among these, silicone rubber and silicone-modified fluorine-containing rubber are preferably used in that they are high in molding and processing ability and electrical insulating properties.

The second upper-side anisotropically conductive sheet 47 and third upper-side anisotropically conductive sheet 25 are the so-called dispersed type anisotropically conductive sheets that conductive particles P are contained in an elastic polymeric substance in a state they are oriented so as to arrange in rows in a thickness-wise direction thereof to form chains, and the chains by the conductive particles P are dispersed in a plane direction thereof.

As the elastic polymeric substances and conductive particles P making up these second upper-side anisotropically conductive sheet 47 and third upper-side anisotropically conductive sheet 25, may be used the same materials as the elastic polymeric substance and conductive particles P making up the first upper-side anisotropically conductive sheet 20.

In the lower-side adaptor 50, an other-side circuit board 51 for inspection is provided, and an inspection electrode pair composed of an inspection electrode 52 for current supply and an inspection electrode 53 for voltage measurement, which are arranged in a state separated from each other, to one other-side electrode 3 to be inspected of the circuit board 1 to be inspected in accordance with a pattern corresponding to an arrangement pattern of the other-side electrodes 3 to be inspected, is arranged on the front surface (upper surface in FIG. 8) of the other-side circuit board 51 for inspection so as to be located within a region of an area equivalent to the region occupied by the other-side electrode 3 to be inspected. Terminal electrodes 52a for current supply and terminal electrodes 53a for voltage measurement are arranged according to a pattern corresponding to the arrangement pattern of standard arrangement electrodes 61 of an electrode plate 60, which will be described subsequently, on the back surface of the other-side circuit board 51 for inspection. These terminal electrodes 52a for current supply and terminal electrodes 53a for voltage measurement are respectively electrically connected to their corresponding inspection electrodes 52 for current supply and inspection electrodes 53 for voltage measurement.

On the front surface of the other-side circuit board 51 for inspection, are provided common elastic connecting members 56 which each come into contact with surfaces (upper surfaces in FIG. 8) of both inspection electrode 52 for current supply and inspection electrode 53 for voltage measurement, which make up the inspection electrode pair. The elastic connecting members 56 are held by a sheet-like holding member 57 provided on the front surface of the other-side circuit board 51 for inspection in a state that their surfaces (upper surfaces in FIG. 8) have projected from the surface of the holding member 57. In the embodiment illustrated in the figure, a plurality of the elastic connecting members 56 are provided, in a state independently of each other, corresponding to the respective other-side electrodes 3 to be inspected in the circuit board 1 to be inspected.

The electrode plate 60 is provided on the back surface (lower surface in FIG. 8) of the other-side circuit board 51 for inspection through a lower-side anisotropically conductive sheet 62.

The electrode plate 60 and the lower-side anisotropically conductive sheet 62 correspond to the electrode plate 48 and second upper-side anisotropically conductive sheet 47 in the upper-side adaptor 40, respectively. The electrode plate 60 has, on the surface thereof (upper surface in FIG. 8), the standard arrangement electrode 61 arranged on standard lattice points having a pitch of, for example, 2.54 mm, 1.8 mm or 1.27 mm. The standard arrangement electrodes 61 are respectively electrically connected to the terminal electrodes 52a for current supply or the terminal electrodes 53a for voltage measurement of the other-side circuit board 51 for inspection through the lower-side anisotropically conductive sheet 62 and to the tester 59 through inner wiring (not illustrated) of the electrode plate 60.

The elastic connecting members 56 are preferably formed by, for example, an anisotropically conductive elastomer that exhibits high conductivity in its thickness-wise direction. In such an anisotropically conductive elastomer, conductive particles are filled into, for example, an insulating elastic polymeric substance in a state oriented so as to align in the thickness-wise direction (vertical direction in the drawings), thereby exhibiting high conductivity in the thickness-wise direction. In particular, a pressure-sensitive anisotropically conductive elastomer that conductive paths extending in the thickness-wise direction are formed when it is pressurized and compressed in the thickness-wise direction is preferred.

Such elastic connecting members 56 can be formed in accordance with any proper process, for example, a process described in Japanese Patent Application Laid-Open No. 2000-74965.

Each of the elastic connecting members 56 preferably has higher conductivity in its thickness-wise direction than that in a plane direction perpendicular to the thickness-wise direction. Specifically, the elastic connecting member 56 preferably has electrical properties that a ratio of the electric resistance value in the thickness-wise direction to the electric resistance value in the plane direction is 1 or lower, particularly 0.5 or lower.

If the ratio exceeds 1, a current flowing between the inspection electrode 52 for current supply and the inspection electrode 53 for voltage measurement through the elastic connecting member 56 becomes high, so that it may be difficult in some cases to measure electric resistance with high precision.

From such a point of view, when the elastic connecting members 56 are formed by causing conductive particles to be contained in an insulating elastic polymeric substance, the filling rate of the conductive particles is preferably 5 to 50% by volume.

A clearance between the inspection electrode 52 for current supply and the inspection electrode 53 for voltage measurement in the other-side circuit board 51 for inspection is preferably at least 10 μm. If this clearance is shorter than 10 μm, a current flowing between the inspection electrode 52 for current supply and the inspection electrode 53 for voltage measurement through the elastic connecting member 56 becomes high, so that it may be difficult in some cases to measure electric resistance with high precision.

On the other hand, the upper limit of the clearance is determined by the size of the respective inspection electrodes and the size and pitch of their corresponding other-side electrodes 3 to be inspected, and is generally at most 500 μm. If this clearance is too long, it may be difficult in some cases to suitably arrange both inspection electrodes to one of the other-side electrodes 3 to be inspected.

In the above-described electric resistance-measuring apparatus for circuit boards, an electric resistance between any one-side electrode 2 to be inspected and its corresponding other-side electrode 3 to be inspected in the circuit board 1 to be inspected is measured in the following manner.

The circuit board 1 to be inspected is arranged at a necessary position between the upper-side adaptor 40 and the lower-side adaptor 50, and in this state, the upper-side adaptor 40 is lowered, and the lower-side adaptor 50 is lifted, thereby bringing the third upper-side anisotropically conductive sheet 25 into contact under pressure with one surface of the circuit board 1 to be inspected and at the same time, bringing the elastic connecting members 56 of the lower-side adaptor 50 into contact under pressure with the other surface of the circuit board 1 to be inspected. This state is a measurable state.

Specifically described with reference to FIG. 9, in this measurable state, the core electrodes 13 and ring-like electrodes 15 in the connector 10 for measurement of electric resistance are electrically connected at the same time to their corresponding one-side electrodes 2 to be inspected of the circuit board 1 to be inspected through the conductive paths formed in the third upper-side anisotropically conductive sheet 25. The core electrodes 13 and ring-like electrodes 15 are in a state electrically independent of each other.

On the other hand, the inspection electrode pairs each composed of the inspection electrode 52 for current supply and the inspection electrode 53 for voltage measurement are electrically connected to their corresponding other-side electrodes 3 to be inspected of the circuit board 1 to be inspected through the elastic connecting members 56.

In such a state, one of a plurality of the one-side electrodes 2 to be inspected in the circuit board 1 to be inspected is designated, and one of the core electrode 13 and ring-like electrode 15 electrically connected to this designated electrode 2 to be inspected is used as an electrode for current supply, and the other is used as an electrode for voltage measurement, whereby a current is supplied between the core electrode 13 or ring-like electrode 15 used as the electrode for current supply and the inspection electrode 52 for current supply of the inspection electrode pair electrically connected to the other-side electrode 3 to be inspected corresponding to the designated one-side electrode 2 to be inspected, and at the same time, voltage between the core electrode 13 or ring-like electrode 15 used as the electrode for voltage measurement and the inspection electrode 53 for voltage measurement of the inspection electrode pair electrically connected to the other-side electrode 3 to be inspected corresponding to the designated one-side electrode 2 to be inspected is measured, whereby measurement of an electric resistance between the designated one-side electrode 2 to be inspected and its corresponding other-side electrode 3 to be inspected can be performed.

According to the electric resistance-measuring apparatus for circuit boards of the above-described construction, the connector 10 for measurement of electric resistance of the construction shown in FIG. 1 is provided, so that at least a part of the ring-like electrode 15 is located on the one-side electrode 2 to be inspected in the circuit board 1 to be inspected so far as alignment is conducted in such a manner that at least a part of the core electrode 13 in the connector 10 for measurement of electric resistance is located on the one-side electrode 2 to be inspected, whereby electrical connection of both core electrodes 13 and ring-like electrodes 15 to the one-side electrodes 2 to be inspected can be surely achieved even when the circuit board 1 to be inspected is large in area and has a great number of small-sized one-side electrodes 2 to be inspected. In addition, since the core electrodes 13 and ring-like electrodes 15 are electrically insulated from each other, an electric resistance as to the circuit board 1 to be inspected can be measured with high precision by using one of the core electrode 13 and ring-like electrode 15 electrically connected to the one-side electrode 2 to be inspected as an electrode for current supply and the other as an electrode for voltage measurement.

The present invention is not limited to the above-described embodiments, and such various changes or modifications as described below may be added thereto.

For example, the third upper-side anisotropically conductive sheet 25 is not essential, and the electric resistance-measuring apparatus for circuit boards may be so constructed that the core electrodes 13 and ring-like electrodes 15 in the connector 10 for measurement of electric resistance come into direct contact with the one-side electrodes 2 to be inspected.

As the other-side circuit board 51 for inspection of the lower-side adapter 50, those of various types may be used so far as a state that the inspection electrode 52 for current supply and inspection electrode 53 for voltage measurement making up the inspection electrode pair have been electrically connected to one of the other-side electrodes 3 to be inspected can be achieved.

As the elastic connecting members 56, may also be used an anisotropically conductive elastomer having conductive path-forming portions, which extend, independently of each other, in the thickness-wise direction at positions corresponding to the inspection electrodes 52 for current supply and the inspection electrodes 53 for voltage measurement, and insulating portions for electrically insulating the conductive path-forming portions from one another.

Inspection electrodes, on the tips of which a conductive elastomer is provided, and further probe pins, if permitted, may also be used as inspection electrodes.

When the circuit board to be inspected, which is subjected to electric resistance measurement, has protruding one-side electrodes to be inspected, that of the construction shown in FIG. 7 is preferably used as the connector 10 for measurement of electric resistance.

Figure 10:
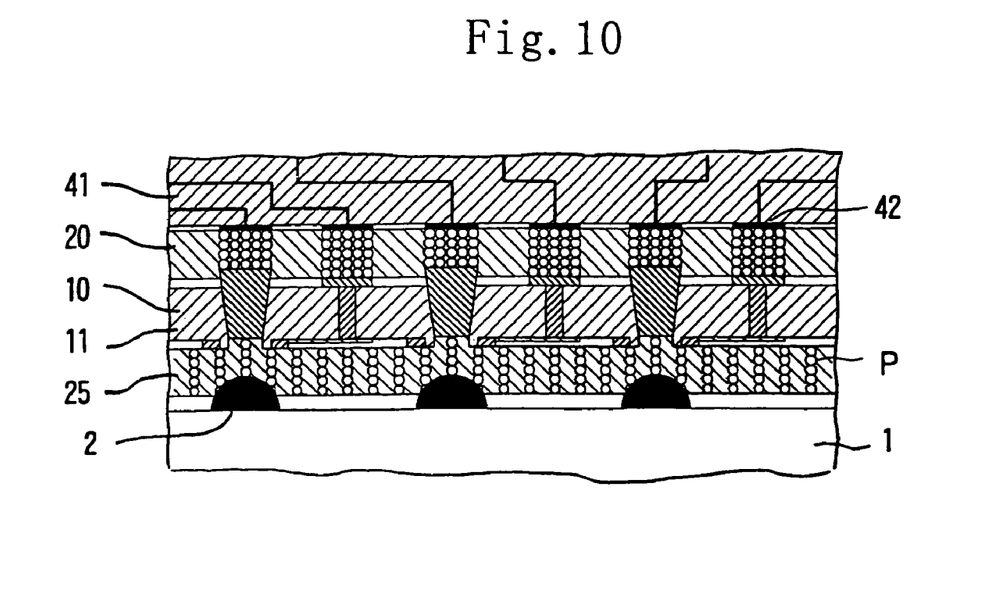
FIG. 10 is a cross-sectional view illustrating the construction of a principal part of an electric resistance-measuring apparatus for circuit boards according to another embodiment of the present invention together with a circuit board to be inspected.

According to the electric resistance-measuring apparatus having such a connector 10 for measurement of electric resistance, as illustrated in FIG. 10, the conductors 12 of the connector 10 for measurement of electric resistance are moved in the thickness-wise direction according to the projected height of protruding one-side electrodes 2 to be inspected when the third upper-side anisotropically conductive sheet 25 are brought into contact under pressure with the one-side electrodes 2 to be inspected, so that the irregularity-absorbing properties of the second upper-side anisotropically conductive sheet 20 and third upper-side anisotropically conductive sheet 25 can be effectively utilized. Accordingly, high reliability on connection is achieved even to a circuit board 1 to be inspected that has protruding one-side electrodes 2 to be inspected projected from the one surface, a scatter of projected height of said protruding one-side electrodes 2 to be inspected being great. As a result, necessary measurement of electric resistance can be surely performed with high precision.

The present invention will hereinafter be described specifically by the following Examples. However, the present invention is not limited thereto.

In the following Examples, a single-sided printed circuit board of the following specification was used as a circuit board to be inspected.

A single-sided printed circuit board having dimensions of 4 cm long by 15 cm wide, in which 6 electrode groups in total each composed of 64 electrodes to be inspected having a diameter of 300 µm and arranged at a pitch of 0.5 mm are formed on one surface thereof (the total number of electrodes to be inspected: 384), and every 2 electrodes among the 64 electrodes to be inspected in each electrode group are electrically connected to each other through inner wiring to form a circuit (the number of circuits in each electrode group: 32; the total number of circuits: 192).

EXAMPLE 1

A base plate material obtained by integrally forming copper foils having a thickness of 12 µm on both surfaces of an insulating base plate composed of a glass fiber-reinforced epoxy resin and having dimensions of 5 cm long by 18 cm wide and a thickness of 100 µm was provided, and a plurality of through-holes for short circuit parts having a diameter of 120 µm were formed correspondingly to short circuit parts in the intended connector for measurement of electric resistance in this base plate material by means of an NC drilling machine. Positions, at which these through-holes for short circuit parts are formed, were positions 250 µm away from respective central positions of core electrodes in the intended connector for measurement of electric resistance.

The base plate material, in which the through-holes for short circuit parts had been formed, was then subjected to a plating treatment with copper under conditions of 25° C. and 45 minutes, thereby forming short circuit parts within the through-holes for short circuit parts. Photolithography and an etching treatment were then conducted, whereby circular electrode layers for formation of ring-like electrodes, which had a diameter of 150 µm, and wiring parts for linking the circular electrode layers with the short circuit parts, respectively, were formed on the front surface of the insulating base plate.

Through-holes each having an inner diameter of 100 µm and extending through the insulating base plate and circular electrode layer and having an inner diameter of 100 µm were then formed in this base plate material by means of the NC drilling machine, thereby forming ring-like electrodes having an outer diameter of 150 µm and an inner diameter of 100 µm. Thereafter, liquid silicone rubber was filled into each of the through-holes and cured, thereby forming columnar filler members in the respective through-holes.

The respective filler members were then subjected to laser beam machining, from the back surface side, thereby forming truncated cone-like through-holes for formation of conductors. The through-holes for formation of the conductors had an opening diameter of 80 µm on the side of a front surface and an opening diameter of 100 µm on the side of a back surface. The interiors of the through-holes for formation of the conductors in the respective filler members were then subjected to a plating treatment with copper, thereby forming truncated cone-like conductors composed of copper, the front surface-side ends of which were provided as core electrodes having a diameter of 70 µm, and the back surface-side ends of which were provided as relay electrodes having a diameter of 100 µm, in the through-holes for formation of the conductors.

The copper foil formed on the back surface of the insulating base plate was then subjected to photolithography and an etching treatment, thereby forming relay electrodes having a diameter of 100 µm, which were electrically connected to their corresponding ring-like electrodes through the respective short circuit parts and wiring parts, to produce a connector for measurement of electric resistance.

Incidentally, in the above-described process, a resist layer was formed on both surfaces of the insulating base plate except for the time for surface processing to protect it.

The connector for measurement of electric resistance produced in such a manner was used to produce an electric resistance-measuring apparatus having only an upper-side adaptor shown in FIG. 8.

Comparative Example 1

An electric resistance-measuring apparatus having a circuit board for inspection, on the front surface of which electrodes for current supply and electrodes for voltage measurement were formed corresponding to electrodes to be inspected, a connecting member composed of a conductive elastomer provided on a front surface of the circuit board for inspection, and a holding member was produced in accordance with the construction described in Japanese Patent Application Laid-Open No. 2000-74965.

In the circuit board for inspection, the electrodes for current supply and electrodes for voltage measurement each had dimensions of 50 μm by 100 μm, a clearance between the electrode for current supply and the electrode for voltage measurement was 150 μm, the thickness of the connecting member was 0.4 mm, silicone rubber was used as an elastic polymeric substance for forming the connecting member, and nickel particles plated with gold, which had an average particle diameter of 40 μm, were used as conductive particles.

[Evaluation]

A total of 100 circuit boards to be inspected of the above-described specification were provided, and an electric resistance of each circuit in these circuit boards to be inspected was measured by means of the electric resistance-measuring apparatus according to Example 1 and Comparative Example 1 to make a judgment of bad connection when the measured value of the electric resistance in the circuit was 1 Ω or higher, thereby counting the number thereof.

As a result, the number of circuits exhibiting the electric resistance value of 1 Ω or higher was 0 among 19,200 circuits (192 circuits×100) in the electric resistance-measuring apparatus according to Example 1, but was 510 among 19,200 circuits in the electric resistance-measuring apparatus according to Comparative Example 1.

Effects of the Invention

According to the present invention, as described above, there can be provided connectors for measurement of electric resistance, and electric resistance-measuring apparatus for circuit boards and methods of measurement of electric resistance, by which necessary electrical connection to a circuit board to be inspected, which is subjected to electric resistance measurement, can be surely achieved even when the circuit board to be inspected is large in area and has a great number of small-sized electrodes to be inspected, and expected measurement of electric resistance can be surely performed with high precision.

The invention claimed is:

1. A connector for measurement of electric resistance, comprising:
    an insulating base plate,
    a plurality of connecting electrode pairs provided on a front surface of the insulating base plate and arranged in accordance with a pattern corresponding to a pattern of a plurality of electrodes on a circuit board to be inspected using an electric resistance measurement, wherein each connecting electrode pair comprises:
        a core electrode having an end part extending to the front surface of the base plate and an other end part extending to a back surface of the base plate, the core electrode being supported by the insulating plate such that the core electrode can move in a thickness-wise direction with respect to the insulating plate; and
        a ring-like electrode arranged on the front surface so as to surround the core electrode in a state electrically insulated from the core electrode, and
    a plurality of relay electrodes provided on a back surface of the insulating base plate, each relay electrode being electrically connected to either one of the core electrode, or ring-like electrode of a respective connecting electrode pair.

2. A connector for measurement of electric resistance according to claim 1, which is arranged on one side of a circuit board to be inspected, wherein
    the core electrodes and ring-like electrodes of the connecting electrode pairs of the connector are electrically connected at the same time to respective electrodes on the circuit board to be inspected, thereby realizing a measurable state, and
    in the measurable state, one of the core electrode and ring-like electrode electrically connected to one designated electrode to be inspected is used as an electrode for current supply and the other is used as an electrode for voltage measurement, thereby performing measurement of electric resistance related to the designated one electrode to be inspected.

3. The connector for measurement electric resistance according to claim 2, wherein
    in the measurable state, the connecting electrode pairs are electrically connected with their corresponding relay electrodes through an anisotropically conductive sheet.

4. A method of measurement of electric resistance for circuit boards, which comprises arranging the connector for measurement of electric resistance according to claim 1 on one side of a circuit board to be inspected, which is subjected to electric resistance measurement,
    electrically connecting the core electrodes and ring-like electrodes of the connecting electrode pairs of the connector for measurement of electric resistance at the same time to respective one-side electrodes to be inspected of the circuit board to be inspected, thereby realizing a measurable state, and
    in this measurable state, using one of the core electrode and ring-like electrode electrically connected to one designated one-side electrode to be inspected as an electrode for current supply and the other as an electrode for voltage measurement, thereby performing measurement of electric resistance related to the designated a one-side electrode to be inspected.

5. The connector for measurement of electric resistance according to claim 1, wherein the core electrode comprises a tapered cross-sectional shape that increases in width as the core electrode extends toward the back surface of the base plate.

6. The connector for measurement of electric resistance according to claim 1, wherein a diameter of the core electrode is 30–80% of the diameter of the electrode on the circuit board to be inspected.

7. The connector for measurement of electric resistance according to claim 6, wherein an inner diameter of ring-like electrode is 50–100% of the diameter of the electrodes to be inspected.

8. An electric resistance-measuring apparatus for circuit boards, comprising:
    a first connector for measuring a first side of a circuit board, comprising:
        a first insulating base plate,
        a plurality of first connecting electrode pairs provided on a front surface of the first insulating base plate and arranged in accordance with a pattern corresponding to a pattern of a plurality of electrodes on the first side of the a circuit board to be inspected using an electric resistance measurement, wherein each first connecting electrode pair comprises:
  a first core electrode having an end part extending to the front surface of the first base plate and an other end part extending to a back surface of the first base plate, the first core electrode being supported by the insulating plate such that the first core electrode can move in a thickness-wise direction with respect to the first insulating plate, and
  a first ring-like electrode arranged on the front surface so as to surround the first core electrode in a state electrically insulated from the first core electrode, and
  a plurality of first relay electrodes provided on a back surface of the insulating base plate, each relay electrode being electrically connected to either one of the first core electrode, or first ring-like electrode of a respective first connecting electrode pair; and
a second connector for measuring a second side of a circuit board, comprising:
  a second insulating base plate,
  a plurality of second connecting electrode pairs provided on a front surface of the second insulating base plate and arranged in accordance with a pattern corresponding to a pattern of a plurality of electrodes on the second side of the a circuit board to be inspected using an electric resistance measurement, wherein each second connecting electrode pair comprises:
    a second core electrode having an end part extending to the front surface of the second base plate and an other end part extending to a back surface of the second base plate, the second core electrode being supported by the insulating plate such that the second core electrode can move in a thickness-wise direction with respect to the second insulating plate, and
    a second ring-like electrode arranged on the front surface so as to surround the second sore electrode in a state electrically insulated from the second core electrode, and
    a plurality of second relay electrodes provided on a back surface of the insulating base plate, each relay electrode being electrically connected to either one of the second core electrode, or second ring-like electrode of a respective second connecting electrode pair.

9. An electric resistance-measuring apparatus for circuit boards according to claim 8, wherein
  the core electrodes and ring-like electrodes of the connecting electrode pairs of the first or second connector are electrically connected at the same time to respective electrodes in the circuit board to be inspected, thereby realizing a measurable state, and
  in the measurable state, one of the core electrode and ring-like electrode electrically connected to one designated electrode to be inspected is used as an electrode for current supply and the other is used as an electrode for voltage measurement, thereby performing measurement of electric resistance related to the designated one electrode to be inspected.

10. The connector for measurement of electric resistance according to claim 8, wherein, in the measurable state, the connecting electrode pairs of the first or second boards are electrically connected with their corresponding relay electrodes through an anisotropically conductive sheet.

11. The connector for measurement of electric resistance according to claim 8, wherein at least one of the first or second core electrodes comprise a tapered cross-sectional shape that increases in width as the core electrode extends toward the back surface of the base plate.

12. The connector for measurement of electric resistance according to claim 8, wherein a diameter of at least one of the first or second core electrodes is 30–80% of the diameter of the electrode on the circuit board to be inspected.

13. The connector for measurement of electric resistance according to claim 12, wherein an inner diameter of at least one of the first or second ring-like electrode is 50–100% of the diameter of the electrodes to be inspected.

* * * * *